United States Patent
Pavan et al.

(10) Patent No.: US 8,133,358 B2
(45) Date of Patent: Mar. 13, 2012

(54) METHOD AND APPARATUS FOR PRODUCING A METAL WIRE COATED WITH A LAYER OF METAL ALLOY

(75) Inventors: Federico Pavan, Milan (IT); Simone Agresti, Milan (IT)

(73) Assignee: Pirelli Tyre S.p.A., Milan (IT)

( * ) Notice: Subject to any disclaimer, the term of this patent is extended or adjusted under 35 U.S.C. 154(b) by 764 days.

(21) Appl. No.: 10/594,316

(22) PCT Filed: Mar. 31, 2004

(86) PCT No.: PCT/EP2004/003623
§ 371 (c)(1),
(2), (4) Date: Sep. 27, 2006

(87) PCT Pub. No.: WO2005/095668
PCT Pub. Date: Oct. 13, 2005

(65) Prior Publication Data
US 2007/0205094 A1 Sep. 6, 2007

(51) Int. Cl.
*C23C 14/34* (2006.01)

(52) U.S. Cl. ......... 204/192.12; 204/298.27; 204/298.24; 204/298.26

(58) Field of Classification Search ............. 204/192.12, 204/298.26, 298.27, 298.24
See application file for complete search history.

(56) References Cited

U.S. PATENT DOCUMENTS

| | | | |
|---|---|---|---|
| 3,979,273 A | 9/1976 | Panzera et al. | |
| 4,101,731 A * | 7/1978 | Marancik | 174/125.1 |
| 4,252,626 A | 2/1981 | Wright et al. | |
| 4,851,095 A * | 7/1989 | Scobey et al. | 204/192.12 |
| 4,880,515 A | 11/1989 | Yoshikawa et al. | |
| 5,135,554 A * | 8/1992 | Rogers et al. | 65/446 |
| 5,292,419 A * | 3/1994 | Moses et al. | 204/298.28 |
| 5,556,519 A * | 9/1996 | Teer | 204/192.12 |
| 5,972,160 A * | 10/1999 | Straemke | 156/345.43 |

FOREIGN PATENT DOCUMENTS

| | | |
|---|---|---|
| EP | 0 241 721 | 10/1987 |
| EP | 0 514 658 | 11/1992 |
| EP | 0 669 409 | 8/1995 |
| EP | 0 694 631 | 1/1996 |
| EP | 0 949 356 | 10/1999 |

\* cited by examiner

Primary Examiner — Keith Hendricks
Assistant Examiner — Jason M Berman
(74) Attorney, Agent, or Firm — Finnegan, Henderson, Farabow, Garrett & Dunner, L.L.P.

(57) ABSTRACT

A method and an apparatus for producing a steel wire for reinforcing an elastomeric material. The steel wire has a metal core and a coating layer made of a metal alloy material having a composition including at least one first metal component and at least one second metal component. The method includes the steps of: a) conveying the steel core along a predetermined path in a substantially continuous manner; b) co-sputtering at least one first powered cathode made of said first metal component and at least one second powered cathode made of said second metal component onto the steel core being moved along the predetermined path to obtain a coating layer made of a metal alloy material of a first composition; and c) adjusting the power provided to at least one of the first and second cathodes to obtain a coating layer made of a metal alloy material of a second composition.

6 Claims, 1 Drawing Sheet

METHOD AND APPARATUS FOR PRODUCING A METAL WIRE COATED WITH A LAYER OF METAL ALLOY

CROSS REFERENCE TO RELATED APPLICATION

This application is a national phase application based on PCT/EP2004/003623, filed Mar. 31, 2004, the content of which is incorporated herein by reference.

FIELD OF THE INVENTION

The present invention refers to a method and to an apparatus for producing a coated steel wire suitable for reinforcing elastomeric materials, such as for example semi-finished products intended for the manufacture of tires, tubes, conveyor belts, transmission belts and cables.

In particular, the present invention refers to a method and to an apparatus for producing a coated steel wire of the type comprising a steel core and a coating layer made of a metal alloy material.

The present invention further relates to a method and an apparatus for producing a metal cord comprising a plurality of the above-mentioned coated steel wires.

PRIOR ART

Generally, tire manufacturing methods make use of coated steel wires or cords (the latter comprising a plurality of wires stranded together) which are embedded in an elastomeric material to form, for example, a belt layer or a carcass layer of a tire.

The steel core is typically provided with a metal coating layer to carry out the dual function of providing a suitable corrosion resistance to the wire and of ensuring a good adhesion thereof to the vulcanized elastomeric material.

For example, documents EP-A-0 669 409; EP-A-0 694 631 and EP-A-0 949 356—in the name of the Applicant—disclose methods for producing a coated steel wire comprising the step of electrochemically depositing a metal coating onto the steel core, said metal coating consisting of an alloy of at least two metal components.

In case a brassed coating is provided onto a steel wire by means of electrochemical deposition, the method essentially involves the following steps:
- an electrodeposition step in two distinct electrolytic baths, in which a copper plating and a zinc plating of the steel core are successively carried out;
- a thermal treatment step to allow zinc diffusion into copper to form the brass alloy;
- a pickling step in acid solution, typically phosphoric acid, for removing the zinc oxides which have been formed on the surface of the coating layer due to the thermal treatment step; and
- a drawing step for obtaining the desired final diameter of the brassed wire.

Conventional methods of such type, although substantially suitable for the purpose, have nevertheless a series of drawbacks which have not been overcome yet, such as, for example, the excessive number of steps, the excessive duration of the above-mentioned diffusion step, the reduction of mechanical resistance of the wire due to said diffusion step (e.g. a reduction in the tensile strength of the coated steel wire, which is even up to 5% of the original tensile strength of the material), the formation of undesired gradients of concentration of copper in the brass coating layer (which reach values equal to about ±3% by weight especially in the radial direction of the wire, the zone at the interface with the steel being richer in copper), the irregular thickness of the brass layer, the formation of β brass having a body-centered cubic structure (which makes the drawing step extremely difficult and results in an excessive wear of the drawing dies) and the presence of areas of the wire which are not completely coated and/or which contain unacceptable amounts of impurities (such as oxides deriving not only from the acid used in the above-mentioned pickling step, but also from the oxides present in the copper plating bath and from those present in the lubricant normally used in the drawing step).

A further deposition technology which can be used to provide a metal core with a metal coating layer is the sputtering technique.

The sputtering technique essentially consists of a ionic bombardment of one or more cathodes (i.e. of targets made of the material to be deposited), typically at an energy equal to about 200-500 eV, with ions of a carrier gas which is obtained under the action of an electrical field generated by applying a voltage between the cathodes and an anode (i.e. the metal core to be coated). More specifically, ions of the carrier gas are accelerated towards the cathodes, essentially causing a series of collisions with a consequent emission of cathode atoms directed towards the anode, towards which free electrons are also accelerated. The free electrons ionize by collision further atoms of carrier gas, whereby the process repeats itself and self-sustains as long as sufficient energy is supplied.

U.S. Pat. No. 3,979,273 discloses the use of a sputtering technique for depositing a metal coating onto a discrete metal article in order to protect the latter from oxidation and corrosion. The method disclosed in this document includes the steps of coating a rotating discrete metal substrate with a first metal and a second metal in a sputtering unit, both steps being carried out—either simultaneously or sequentially—by sputtering two separate cathodes made respectively of the first metal and the second metal. The two cathodes are made of different metal materials and are connected to respective power sources so that a coating made of a binary alloy is formed as long as the sputtering is performed in a simultaneous manner. Due to the discrete nature of the metal articles to be coated, this method is necessarily discontinuous and requires the interruption of the corresponding production process in order to allow the substitution of the coated article with a new substrate to be coated. As a result, the coating method has an intrinsically limited productivity due to the nature of the articles to be coated.

U.S. Pat. No. 4,252,626 discloses a method for depositing relatively thick coating materials on substrate articles having complex geometries by means of a sputtering technique. This method comprises the steps of providing an apparatus including main cathodes either of a given composition or of two different compositions, namely a hollow cylindrical cathode and a post cathode within the hollow cathode forming an annular sputtering chamber therebetween, and at least one supplemental cathode of a different composition with respect to the composition(s) of the main cathodes located within the annular sputtering chamber, and of varying the amount of material sputtered from the supplemental cathode independently of the amount sputtered from the main cathodes by controlling the electric potential applied by the supplemental cathode supply. Due to the discrete nature of the metal articles to be coated, this method is necessarily discontinuous and has an intrinsically limited productivity.

Document EP-A-0 241 721 discloses a method for continuously coating a metal wire of small diameter (less than 30 μm) by means of a sputtering technique. According to this method, the metal core is coated by means of a magnetron sputtering technique. In particular, this method comprises the step of coating the metal core with a metal layer of the same type of the core—i.e. either made of the same metal element of the core or of an alloy metal material sharing at least one component with the metal element of the core—and the step of drawing the coated core. The coating step is carried out by sputtering cathodes having the same composition of the coating. In other words, when a layer made of a metal alloy material is to be deposited onto the metal core, the cathodes are made of such an alloy having the desired composition. As a result, it is necessary to change the cathodes whenever a change of coating composition of the alloy is required, with interruption of the production process and with an increase in the production costs.

SUMMARY OF THE INVENTION

Usually, the market requires coated steel wires whose metal coating layer—which is deposited onto the steel core and is generally made of a metal alloy material—is suitable for different elastomeric compounds into which the wires have to be embedded, for example in tire manufacturing methods.

As a consequence, the manufacturers of coated steel wires are asked to produce a coating layer whose composition—in terms of percentage of each component of the desired metal alloy—has to be varied to address the requirements of the different elastomeric compounds. For instance, in case a steel core coated with a brass layer is considered, typically the steel wire manufacturers are requested to provide the steel core with coating layers having a copper content from 63 to 67% by weight, this percentage depending on the particular chemical reactivity of the elastomeric compound to be associated with the steel wire.

The Applicant has noted that, according to the wire manufacturing methods known in the art, it is possible to modify the composition of the metal coating layer (e.g. to pass from a steel wire coated with a brass layer having a copper content of 63% by weight to a steel wire coated with a brass layer having a copper content of 67% by weight) by interrupting the manufacturing method and modifying the conditions of deposition, e.g. by changing the electrolytic baths in the electrochemical deposition technique.

Therefore, the Applicant has perceived the necessity of providing a method and an apparatus which allow to produce a coated steel wire continuously, i.e. without the need to interrupt the production process, and in an extremely flexible manner, so as to promptly meet the ever changing market demands in terms of composition of the alloy to be deposited.

In the following description and in the subsequent claims, the expression "continuous" is used to indicate the absence, between the steps of the production method, of intermediate storages of semi-finished products, so as to continuously produce a coated steel wire having undefined length or, following the stranding of a plurality of such coated steel wires, a steel cord of undefined length in a single production line.

The Applicant has found that the above-mentioned objectives may be accomplished by submitting to co-sputtering at least one first cathode and at least one second cathode made of a first metal component and, respectively, of a second metal component constituting the desired alloy of the coating layer to be deposited onto a steel core which is continuously conveyed into a sputtering unit, and by adjusting the power provided to at least one of the first and second cathode so as to obtain the desired composition of the metal alloy of the coating layer.

In the present description and in the following claims, the term "co-sputtering" is used to indicate a simultaneous sputtering operation of at least two cathodes—each consisting of a different metal component—so as to deposit onto a steel core a coating layer made of a metal alloy consisting of such at least two metal components.

In the present description and in the following claims, the term "metal component" is used to indicate a single metal element or a combination (e.g. an alloy) of distinct metal elements.

In case a ternary alloy has to be deposited onto the steel core, three distinct cathodes—each one made of a different metal component of the alloy to be deposited—are provided, each cathode being electrically connected to a distinct power generation, at least one of these being adjustable in power, so that the power set-up of at least one of the cathodes may be adjusted to achieve the desired percentage of at least one of the metal components of the alloy (the percentage of the other two metal components deriving accordingly). If each power generation is adjustable, the desired percentage of each metal components of the alloy may be advantageously achieved.

Alternatively, one of the at least two cathodes (for example the first cathode) is made of a binary alloy (e.g. brass) consisting of the first two metal components of the ternary alloy to be deposited and the other cathode of the at least two cathodes (for example the second cathode) is made of the third metal component (e.g. cobalt or tin) of the ternary alloy: in this case the composition of the coating layer can be adjusted with respect to the ratio between the alloy material of the first cathode and the metal component of the second cathode.

In accordance with a first aspect thereof, the present invention relates to a method for producing a coated steel wire, said wire comprising a steel core and a coating layer made of a metal alloy material having a composition including at least one first metal component and at least one second metal component, the method comprising the steps of:
a) conveying the steel core along a predetermined path in a substantially continuous manner;
b) co-sputtering at least one first powered cathode made of said first metal component and at least one second powered cathode made of said second metal component onto the steel core being moved along said path to obtain a coating layer made of a metal alloy material of a first composition, and
c) adjusting the power provided to at least one of said first and second cathode to obtain a coating layer made of a metal alloy material of a second composition.

Thanks to the provision of these steps, it is advantageously possible to produce in a continuous manner a coated steel wire comprising a steel core and a coating layer made of a metal alloy material having said second composition, which is different from said first composition. In fact, in order to meet the market demands, whenever it is required to change the composition of the alloy forming the coating layer from a first to a second composition, it is sufficient to change the power provided to at least one cathode as a function of the desired composition to be obtained. A suitable change in the power provided to at least one cathode, in fact, results in a corresponding change of the amount of the respective metal component which is sputtered onto the steel core. For example, starting from a first batch of production with a steel core coated with a coating layer made of the above-mentioned first composition, it is advantageously possible to pass to a second batch of production with a steel core coated with a coating layer made of the above-mentioned second composition by simply suitably changing the relative power provided to the cathodes, e.g. by changing the power provided to the first cathode made of the first metal component.

Furthermore, thanks to the fact that the metal coating layer is deposited by means of a sputtering technique, according to which the vaporization is activated by a plasma, it is advantageously possible to obtain a coated steel wire whose coating layer is uniform and homogeneous. In other words, it is advantageously possible to obtain a coated steel wire in which the variations of the amount of metal deposited, in the axial and/or in the radial direction of the wire, are advantageously minimized. The formation of concentration gradients of each component of the alloy to be deposited in the axial direction and/or in the radial direction of the wire is also advantageously reduced. Such characteristics of uniformity and homogeneity of the coating layer are particularly important for the purposes of providing the steel wire with a desired corrosion resistance.

Furthermore, the sputtering deposition technique allows to obtain a coating layer having a crystalline structure conveniently deformable in a subsequent drawing step, as described in more detail in the following of the present description. Thus, for example, if the metal coating layer comprises brass, the sputtering deposition technique allows to obtain a layer of brass having a crystalline structure consisting of α brass (face-centered cubic). The deformability of α brass facilitates a subsequent drawing step to be carried out and ensures a remarkable reduction of the wear of the drawing dies to be used in said drawing step.

Thanks to the provision of the sputtering deposition technique, the amount of impurities, such as for example oxides, present in the coating layer is advantageously drastically reduced with respect to the amount present in wires produced by the electrodeposition methods of the prior art.

According to a preferred embodiment of the method of the invention, the above-mentioned step of adjusting the power provided to at least one of the first and second cathode is carried out by independently adjusting the power provided to each of the first and second cathode so as to obtain the above-mentioned desired composition of the metal alloy.

Thanks to the provision of such step, it is advantageously possible to produce in a continuous manner a coated steel wire comprising a steel core and a coating layer made of a metal alloy material having virtually any composition. A suitable change in the power provided to each cathode, in fact, results in a corresponding change of the amount of the respective metal component which is sputtered onto the steel core.

The conveying step is preferably carried out at a speed comprised in the range from about 10 to about 80 m/min.

According to a preferred embodiment of the method of the invention, the steel core is conveyed along a substantially rectilinear path, which can be performed in a simple and economical manner. By way of illustrative example, and as will be apparent from the description of a preferred embodiment of the apparatus of the invention given below, a substantially rectilinear path may be obtained by providing a sputtering unit with an inlet opening and an outlet opening, respectively arranged on opposite sides of the sputtering unit, and with at least one conveying device suitable for conveying the steel core along the direction defined between said inlet and outlet openings of the sputtering unit.

Preferably, the above-mentioned path inside the sputtering unit comprises at least one forward length and a least one backward length, the forward and backward lengths (which define a multipassage path inside the sputtering unit) being spaced apart from each other by a predetermined distance. In this case, the sputtering unit may be provided with an inlet opening and an outlet opening respectively arranged either on the same side or on opposite sides of the sputtering unit.

Preferably, the steel core is conveyed according to a path so as to form a wire bundle inside the sputtering unit. Therefore, according to said embodiment, the coating layer can be sputtered onto the steel core a plurality of times and the residence time of the steel core in the sputtering unit is advantageously increased. Preferably, the wire bundle lies on a horizontal plane.

In the following description, the term "wire bundle" is used to indicate the assembly of successive forward and backward lengths of a steel core inside the sputtering unit, said lengths—each one being preferably parallel to the other and being obtained by inverting the path of the steel core at each side of the deposition chamber—forming a bundle of wire lengths which are co-sputtered by the metal components. In other words, the steel core is conveyed according to a path substantially shaped as a serpentine.

The number of forward and backward lengths, i.e. the number of passages the steel core is subjected to inside the sputtering unit, is conveniently selected as a function of the predetermined thickness of the coating layer to be formed.

Furthermore, the distance between two adjacent lengths is selected as a function of the size of the sputtering unit, taking into account that there is a minimum value of said distance under which there might be an undesired interference among the different beams of sputtered material coming from the first cathode and from the second cathode. For instance, in case this distance is remarkably reduced, it may happen that some areas of the steel core surface are not uniformly reached by the sputtered metal components, thereby negatively affecting the quality of the coating layer.

According to a preferred configuration of the wire bundle, the latter lies on a horizontal plane and comprises wire lengths which are substantially parallel to the longitudinal extension of the sputtering unit. For example, in a sputtering unit having a longitudinal extension of about 5 m and a width of about 50-60 cm, the number of passages of the steel core within such unit is preferably comprised between 15 and 65, the distance between adjacent lengths being preferably comprised between about 0.2 cm and about 0.8 cm. According to such a path of the steel core in the sputtering unit, it is possible to deposit a coating layer having a thickness comprised between about 0.5 μm and about 2.0 μm onto the steel core in a depositing time comprised between about 1.0 min and about 3.0 min depending on the power provided to the cathodes.

According to an alternative configuration of the wire bundle, the latter preferably lies on a horizontal plane and comprises wire lengths which may be substantially perpendicular to the longitudinal extension of the sputtering unit.

According to a further alternative configuration of the wire bundle, the latter may lie on a vertical plane, which configuration is particular suitable when the sputtering unit extends in a substantially vertical manner.

In order to carry out the above-mentioned co-sputtering step, it is possible to use a conventional sputtering unit which includes at least one vacuum deposition chamber provided with a vacuum pump—suitable for creating a predetermined pressure—and with means for supplying a carrier gas.

Preferably, said predetermined pressure is comprised between about $10^{-3}$ mbar and about $10^{-1}$ mbar. More preferably, said predetermined pressure is in the order of $10^{-2}$ mbar.

The co-sputtering step is preferably carried out by sputtering at least one first cathode and at least one second cathode which are provided in the at least one vacuum deposition chamber and which lie on converging planes in such a manner as to sputter said first metal component and, respectively, second metal component along respective first and second converging sputtering directions.

According to a preferred embodiment of the present invention, at least one first cathode and at least one second cathode are arranged below the horizontal plane defined by the wire bundle to be coated, the latter constituting the anode of the sputtering unit. According to a further preferred embodiment, at least one first cathode and at least one second cathode are arranged above the horizontal plane defined by the wire bundle to be coated. According to a further preferred embodiment, at least two first cathodes and at least two second cathodes are arranged above and below the horizontal plane defined by the wire bundle to be coated. In such a case, if the first two cathodes are made of a first metal component and the second two cathodes are made of a second metal component, the cathodes made of the first metal component are preferably arranged alternate with the cathodes made of the second metal component, so as to advantageously ensure the formation of a uniform coating layer made of an alloy of the two metal components.

Preferably, the cathodes are in the form of rectangular or circular plates.

In the following description and in the subsequent claims, the term "sputtering direction" is used to indicate the main direction of the material which is sputtered onto the steel core from a cathode. The sputtering direction, for a cathode having a plate-shaped form, substantially coincides with the direction perpendicular to the plane of cathode.

The formation on the steel core of a coating layer made of an alloy of at least one first metal component and of at least one second metal component is advantageously ensured simply and effectively thanks to the fact that the sputtering directions of said metal components, which are sputtered from the at least one first cathode and from the at least one second cathode, converge and intersect substantially at the wire bundle. The arrangement of the cathodes according to converging planes, in fact, advantageously allows to optimize the direction of the sputtered metal components towards the steel core and, as a consequence, to increase the effectiveness of the coating process and to enhance the formation and the homogeneity of the alloy onto the core.

Preferably, the above-mentioned first and a second converging sputtering directions define an angle of about 60° to 120°, more preferably of about 80° to 100°, between each other.

More preferably, in order to increase the productivity of the method, the co-sputtering step is carried out by arranging at least two first cathodes made of a first metal component and at least two second cathodes made of a second metal component forming respective pairs of cathodes each pair comprising different metal components so that the cathodes of each pair are located on opposite sides with respect to the wire bundle, and by sputtering said first and, respectively, second metal component onto the steel core along respective first and second converging sputtering directions.

Still more preferably, in order to further increase the productivity of the method, the co-sputtering step is carried out by longitudinally arranging along the wire bundle a plurality of groups of cathodes, each of such groups consisting of two pairs of first and second cathodes which are preferably arranged as disclosed above. Preferably, each group of cathodes consists of four cathodes which are arranged according to a substantial quadrilateral configuration which completely surrounds the wire bundle.

According to said preferred embodiment, if a binary alloy has to be deposited, each group of cathodes preferably comprises four cathodes arranged according to a substantial quadrilateral configuration, wherein two cathodes are made of the first metal component and two cathodes are made of the second metal component, the cathodes of the first metal component and the cathodes of the second metal component constituting the opposite sides of said quadrilater. Therefore, two cathodes made of the first and, respectively, of the second metal component are located above the wire bundle and two cathodes made of the first and, respectively, of the second metal component are located below the wire bundle so that two different sputtering beams—each sputtering beam being made of a different metal component—are directed towards each side of the steel core.

A preferred embodiment of the method of the present invention provides that the co-sputtering step is carried out in a simultaneous manner on a plurality of steel cores which are conveyed—along a predetermined conveying direction—inside the sputtering unit. According to said embodiment, the productivity of the method can advantageously be further increased.

According to a further preferred embodiment, the method of the invention comprises the steps of providing a first vacuum deposition chamber and a second vacuum deposition chamber which are arranged in series and of co-sputtering the at least two metal components in at least one of said vacuum deposition chambers by conveying the steel core to be coated in succession through said vacuum deposition chambers.

According to said embodiment, the co-sputtering step is carried out only in one vacuum deposition chamber while the second one is set to a stand-by mode. In such way, when the cathodes of the operative chamber are totally consumed and fresh cathodes have to be provided, the production method does not need to be interrupted since the co-sputtering step can be performed in the second chamber which is switched to an operative mode while the first chamber is put in a stand-by mode. This results in an advantageous increase of the productivity of the method of the invention. Generally, the vacuum deposition chamber which is operative is at a first predetermined pressure adapted to carry out such co-sputtering step.

By way of illustrative example, the method of the invention allows to deposit on a steel core a coating layer, for example made of brass, having a suitable thickness in the order of some microns, preferably comprised between about 0.5 µm and about 3.0 µm.

Preferably, the method of the invention further comprises the step of conveying the steel core into at least one pre-chamber which is subjected to a second predetermined pressure which is higher than said first predetermined pressure, said at least one pre-chamber being arranged upstream of said at least one vacuum chamber.

In such way, the desired vacuum condition is advantageously achieved in at least two subsequent steps, i.e. in a stepwise manner, which is simpler and more convenient from an economical point of view with respect to the achievement of a vacuum condition in a single step.

Furthermore, the provision of at least one pre-chamber advantageously allows to preserve the vacuum deposition chamber (in which the co-sputtering step is carried out) from the contamination of dusts and external agents in general, such as oxygen, which are detrimental to the effectiveness of the formation of the coating layer and to the purity of the alloy constituting the coating layer.

Such advantageous effect can simply be achieved by introducing in the at least one pre-chamber a flow of a chemically inert gas. Preferably, the at least one pre-chamber contains the same gas used as carrier gas in the at least one vacuum deposition chamber, thus allowing to use a supply of gas of the same type both for the pre-chamber and for the vacuum deposition chamber.

More preferably, the above-mentioned chemically inert gas is argon, which is convenient from an economical point of view, thus resulting in a reduction of the production costs.

Preferably, a further pre-chamber subjected to the above-mentioned second predetermined pressure is provided downstream of the at least one vacuum deposition chamber.

Preferably, said second predetermined pressure is comprised between about 0.2 and about 10 mbar, more preferably between about 0.5 and about 5 mbar and, still more preferably, in the order of about 0.5-1.0 mbar.

According to a further preferred embodiment thereof, the method of the invention comprises the step of providing a first vacuum deposition chamber and a second vacuum deposition chamber arranged in series as described above, the first vacuum deposition chamber being arranged downstream of a first pre-chamber as described above and the second vacuum deposition chamber being arranged downstream of a second pre-chamber separating the two vacuum deposition chambers, a third pre-chamber being arranged downstream of the second vacuum deposition chamber.

According to a preferred embodiment of the method of the invention, the above-mentioned co-sputtering step is carried out by means of a magnetron sputtering technique involving a ionic bombardment of at least one first cathode and of at least one second cathode, the at least one first cathode being made of said at least one first metal component and the at least one second cathode being made of said at least one second metal component.

Thanks to the effect exerted by the magnetic field created by the magnetron on the electrically charged particles, and in particular thanks to a confinement action of the electrons in proximity of the cathodes and to an increase of the plasma density, the deposition rate is advantageously increased.

According to the invention, the at least one first cathode and the at least one second cathode are powered by electrically connecting the same to respective independently adjustable first and second power sources. In such a manner, it is advantageously possible to independently adjust the power to be provided to each of the cathodes, thereby adjusting the amount of metal components which is sputtered onto the steel core and, consequently, advantageously modifying the composition of the alloy which is deposited to form the coating layer.

Preferably, the metal coating layer is a binary, ternary, or quaternary alloy.

Preferably, the coating layer is made of an alloy which is different from the steel forming the core.

Preferably, the metal components of the coating layer are selected from the group comprising: copper, zinc, manganese, cobalt, tin, molybdenum, iron, nickel, aluminum and alloys thereof.

More preferably, the first cathode is made of copper and the second cathode is made of zinc, so that the metal coating layer—which is obtained by means of the co-sputtering technique—is made of brass.

In accordance with this preferred embodiment, the coating layer made of brass has a copper content of from about 60 to about 72% by weight, more preferably of from about 64 to about 67% by weight.

If copper is present in a percentage lower than 60% by weight, in fact, there is the undesired formation of β brass, while, if copper is present in a percentage greater than 72% by weight, the wire is excessively reactive with the elastomeric material into which the wire is intended to be embedded. Such a reactivity of the wire with the elastomeric material causes the formation of a thick layer of sulfides on the wire, which sulfides cause an undesired worsening of the wire quality. As a consequence, in the above-mentioned preferred range of values of copper composition, the formation of β brass is advantageously avoided, while maintaining the reactiveness of the wire with elastomeric materials at an acceptable level.

In order to obtain a brass coating layer having the preferred compositions given above, the power which has to be provided to the copper cathode is preferably comprised between about 3 and about 10 kW, while the power to be provided to the zinc cathode is preferably comprised between about 1 and about 6 kW, said values substantially depending on the distance between the cathodes and the steel core.

Alternatively, the coating layer is made of an alloy selected from the group consisting of: Zn—Co, Zn—Mn, Zn—Fe, Zn—Al, Cu—Mn, Cu—Sn, Cu—Zn—Mn, Cu—Zn—Co, Cu—Zn—Sn, Zn—Co—Mo, Zn—Fe—Mo, Zn—Ni—Mo.

The preferred composition of the Zn—Co alloy is 99% Zn, 1% Co; the preferred composition of the Zn—Mn alloy is 98% Zn, 2% Mn; the preferred composition of the Zn—Fe alloy is 95% Zn, 5% Fe; the preferred composition of the Zn—Al alloy is 95% Zn, 5% Al; the preferred composition of the Cu—Mn alloy is 80% Cu, 20% Mn; the preferred composition of the Cu—Sn alloy is 95% Cu, 5% Sn; the preferred composition of the Cu—Zn—Mn alloy is 63% Cu, 34% Zn, 3% Mn; the preferred composition of the Cu—Zn—Co alloy is 63% Cu, 34% Zn, 3% Co; the preferred composition of the Cu—Zn—Sn alloy is 67% Cu, 30% Zn, 3% Sn; the preferred composition of the Zn—Co—Mo alloy is 99% Zn, 0.5% Co, 0.5% Mo; the preferred composition of the Zn—Fe—Mo alloy is 99% Zn, 0.5% Fe, 0.5% Mo; the preferred composition of the Zn—Ni—Mo alloy is 99% Zn, 0.5% Ni, 0.5% Mo.

Particularly preferred alloys are Zn—Co, Zn—Mn and Cu—Mn, which provide the steel wire with a remarkable corrosion resistance.

Preferably, the content of Co in the Zn—Co alloy is comprised between 0.3 and 2% by weight. Preferably, the power to be provided to the cobalt cathode is comprised between about 0.04 and about 0.31 kW, while the power to be provided to the zinc cathode is comprised between about 8.82 and about 8.97 kW.

Preferably, the content of Mn in the Zn—Mn alloy is comprised between 0.3 and 5% by weight. Preferably, the power to be provided to the manganese cathode is comprised between about 0.05 and about 0.82 kW, while the power to be provided to the zinc cathode is comprised between about 8.55 and about 8.97 kW.

Preferably, the content of Mn in the Cu—Mn alloy is comprised between 10 and 5% by weight. Preferably, the power to be provided to the manganese cathode is comprised between about 1.65 and about 4.95 kW, while the power to be provided to the copper cathode is comprised between about 6.30 and about 8.10 kW.

In order to obtain a ternary alloy or an alloy containing more than three metal components, either the first cathode or the second cathode may optionally comprise a further metal component. By way of illustrative example, the first cathode may be made of copper, and the second cathode may comprise zinc and a metal selected from the group comprising: manganese, cobalt, tin, molybdenum, iron, and alloys thereof.

Alternatively, in order to obtain a coating layer made of a ternary alloy, a third cathode made of a third metal component, preferably selected from the group mentioned above, may be provided in addition to said first cathode and said second cathode made of a first metal component (e.g. copper) and, respectively, of a second metal component (e.g. zinc).

A preferred arrangement of a group of three cathodes consists in positioning the three cathodes in such a manner as to sputter the first, the second and the third metal components onto the steel core along respective sputtering directions converging two by two, e.g. according to a triangular configuration, more preferably equilateral, which surrounds the steel core. Also in this case, a plurality of groups—each group consisting of three cathodes—may be provided in the sputtering unit.

For instance, in case the method of the present invention is used to obtain a coating layer made of a ternary Cu—Zn—Mn alloy having the composition of 63% Cu, 34% Zn, 3% Mn by weight, the Cu, Zn and Mn cathodes are advantageously arranged according to a triangular configuration which surrounds the steel core and the power provided to the copper cathode is preferably comprised between 5.7 and 6.8 kW, the power provided to the zinc cathode is preferably comprised between 3.1 and 3.7 kW, the power provided to the manganese cathode is preferably comprised between 0.5 and 0.6 kW depending on the distance between the cathodes and the steel core.

Preferably, the metal coating layer is provided with a predetermined amount of phosphorous so that the drawability of the steel wire is advantageously improved without affecting the adhesion of the coating layer to the elastomeric material in which the coated wire is intended to be embedded. This effect may be accomplished, for instance, by including a predetermined amount of phosphorous in at least one of the cathodes.

Preferably, the coating material comprises phosphorous in an amount of about 1-3% by weight, more preferably in an amount of about 2% by weight, with respect to the total weight of the coating metal.

Advantageously, by including phosphorous in such preferred amount in the metal components to be deposited onto the steel core, the co-sputtering step allows to deposit metal layers comprising phosphorous exactly in the same amount (i.e. 1-3%) in an uniform manner. Therefore, since phosphorous is uniformly present in the whole thickness of the coating layer, the subsequent drawing step is improved thanks to the lubricating action of the phosphorous, independently of the drawing degree which has been set.

Such embodiment is particularly preferred when the coating layer comprises an alloy having poor drawability, such as for example a Zn—Mn alloy.

According to a preferred embodiment of the method of the invention, the steel core has a predetermined initial diameter and the co-sputtering step is carried out until a predetermined initial thickness of the coating layer is attained, the method further comprising the step of drawing the coated steel core until the steel core has a final diameter smaller than said predetermined initial diameter and the coating layer has a final thickness smaller than said predetermined initial thickness.

In the following description and in the subsequent claims, the expressions "initial diameter of the core" and "initial thickness of the coating layer" are used to indicate the diameter of the steel core and, respectively, the thickness of the coating layer before the drawing step is carried out.

In the following description and in the subsequent claims, the expressions "final diameter of the core" and "final thickness of the coating layer" are used to indicate the diameter of the steel core and, respectively, the thickness of the coating layer after the drawing step is carried out.

Preferably, the drawing step is carried out in an emulsion bath which comprises a predetermined amount of a lubricating agent, for example a lubricating oil conventional per se, so that the drawability of the wire is advantageously improved.

More preferably, the lubricating agent is selected from the group comprising: phosphorous containing compounds (e.g. organic phosphates), sulfur containing compounds (e.g. thiols, thioesters, thioethers), chlorine containing compounds (e.g. organic chlorides). Preferably, said lubricants are the so-called "Extreme Pressure Lubricants", i.e. lubricants which decompose at high temperature and pressure (e.g. giving rise to the formation of phosphides, sulfides and chlorides of iron, copper or zinc).

Preferably, the step of drawing the coated wire is carried out by means of drawing dies made of tungsten carbide or of diamond, which are conventional per se.

Furthermore, thanks to the fact that the coating layer is deposited by sputtering, the percentage variation of the amount of said lubricating agent in said coating layer is lower than about 1% by weight, more preferably comprised between about 0.01% and about 1% by weight, in the radial direction of the wire with respect to the weight of the metal forming the coating layer.

In an analogous manner, the percentage variation of the amount of said lubricating agent in said coating layer is lower than about 1% by weight, more preferably comprised between about 0.01% and about 1% by weight, in the axial direction of the wire with respect to the weight of the metal forming the coating layer.

Preferably, the drawing step is carried out in such a way as to obtain a steel core having a final diameter which is reduced of about 75-95% with respect to the initial diameter thereof, more preferably of about 80-90% and, still more preferably, of about 85% with respect to the initial diameter.

In accordance with a preferred embodiment of the method of the invention, the drawing step is carried out in such a way as to obtain a coating layer having a final thickness which is reduced by about 75-95% with respect to the initial thickness thereof, more preferably by about 78-88% and, still more preferably, by about 83% of the initial thickness.

Preferably, the initial diameter of the steel core is comprised between about 0.85 mm and about 3.00 mm and the drawing step is carried out in such a way as to obtain a steel core having a final diameter comprised in the range 0.10-0.50 mm.

Preferably, the initial thickness of the coating layer is comprised between about 0.5 and about 2 μm and the drawing step is carried out in such a way as to obtain a metal coating layer having a final thickness comprised in the range 80-350 nm.

Preferably, the initial thickness of the coating layer is at least about 0.5 μm. Still more preferably, the initial thickness of the coating layer is between about 0.5 and about 2 μm.

In such a way, a suitable value of the initial thickness of the coating layer in view of the drawing step of the coated steel core is obtained, which allows to obtain the desired value of final diameter of the core and an advantageous increase of the properties of mechanical resistance of the wire. For illustrative purposes, a wire having an initial breaking load—i.e. before the drawing step of the coated core—equal to about 1200 MPa can reach—due to the drawing step of the coated core—a final breaking load of about 3200 MPa.

Preferably, the initial diameter of the core is comprised between about 0.85 mm and about 3 mm and the drawing step is carried out in such a way as to obtain a core having a final diameter comprised in the range 0.10-0.50 mm.

Preferably, the initial thickness of the coating layer is comprised between about 0.5 and about 2 μm and the drawing step is carried out in such a way as to obtain a coating layer having a final thickness comprised in the range 80-350 nm.

Additional manufacturing methods intended to produce a metal cord as final product by using the coated core as starting product may be carried out. By way of illustrative example, in order to produce a metal cord comprising a plurality of coated steel wires, a stranding step of said plurality of coated steel wires may be provided after the drawing step is carried out on the coated core.

The method of the present invention may optionally also include one or more preliminary steps aimed at obtaining a steel core of a predetermined diameter starting from a wire rod.

For example a mechanical removal of the oxides present on the wire rod, known in the field with the term of descaling, may be carried out. The descaling step is carried out to smooth the wire rod, i.e. to substantially eliminate the roughness thereof. In such way, any surface roughness, which may have a remarkable depth in the case of a rod made of steel, typically in the range of from about 1.5 μm to 2.0 μm, is advantageously eliminated, thus improving the adhesion of the coating layer to the core in the successive depositing step and the effectiveness of the deposition step. The descaling step is preferably followed by a dry drawing of the wire rod, at the end of which a steel core having a predetermined initial diameter is obtained.

Subsequently to these preliminary steps, according to a preferred embodiment of the method of the invention, the steel core undergoes a surface treatment which is aimed to remove oxides possibly present on the steel core surface. The surface treatment preferably comprises the steps of pickling, washing and optionally drying the steel core. The pickling step is carried out by introducing the steel core into a pickling bath, such as for example a bath containing sulfuric acid. Successively, the pickled core is washed by means of water and optionally dried, preferably by means of hot air produced by a blower (e.g. at a temperature from about 70° C. to about 90° C., more preferably at a temperature of about 80° C.).

Alternatively to the pickling step, the core may undergo alternative surface treatments, such as for example etching, cleaning and activation by a plasma etching technique, for example by conveying argon ions onto the core surface.

According to an alternative embodiment of the method of the invention, the above-mentioned surface treatment, such as for example the pickling or any other alternative treatment suitable for the purpose, may be carried out on a wire rod, preferably preliminarily descaled, and the surface treatment is followed by a dry drawing aimed at obtaining a steel core having a predetermined initial diameter.

The steel core is preferably superficially treated according to one of the above-mentioned procedures before being coated so as to predispose the surface of the steel core to being coated, i.e. to obtain a steel core adapted to uniformly receive the coating layer on the whole surface thereof. Thanks to this preliminary treatment, it is advantageously possible to obtain a steel wire of improved quality. In other words, any macrorugosity or unevenness of the core surface is advantageously substantially eliminated, thus rendering the core surface suitable for the deposition of the coating layer thereon.

Preferably, the steel core is also thermally treated before being coated, so as to advantageously obtain a structure suitable for a cold deformation, such as the deformation involved in the above-mentioned optional drawing step. Preferably, the thermal treatment—which is carried out to cause annealing of steel—consists in a patenting thermal treatment which may be carried out in a furnace is a patenting treatment which is carried out in a furnace. The patenting step is aimed to provide the steel core with a pearlitic structure which has a very high work-hardening coefficient and thus can be easily drawn.

By way of indication only, said thermal treatment of the steel core preferably comprises the step of gradually heating the core to a predetermined temperature, such as for example comprised between about 900° C. and about 1050° C. for a time of about 20-40 s, and the subsequent step of cooling the core to a predetermined temperature, such as for example comprised between about 520° C. and about 580° C. for a time of about 5-20 s. Preferably, the cooling step is carried out by introducing the steel core into a molten lead bath. Alternatively, the cooling step is carried out by introducing the steel core into a bath of molten salts (i.e. chlorates, carbonates), by passing the steel core through zirconium oxide powders or by means of air.

According to a preferred embodiment, the method of the invention further comprises the step of dry drawing the core before the above-mentioned thermal treatment, preferably in such a manner to obtain a slight reduction of the core diameter, such as for example comprised between about 1% and about 3%.

The method of the present invention preferably further comprises an additional thermal treatment, which is preferably carried out at the same working conditions mentioned above and which comprises an additional gradual heating step and a subsequent cooling step of the steel core.

When a first and a second thermal treatment are provided, a further dry drawing is preferably carried out after the first thermal treatment. If additional thermal treatments are provided, a dry drawing between each couple of thermal treatments is preferably carried out.

When a single thermal treatment is provided, a further slight dry drawing is preferably carried out by using a drawing die which is preferably connected in an gas-tight manner with the vacuum deposition chamber, at the inlet thereof. More preferably, such slight drawing step may be carried out by means of a so-called split drawing die, which essentially comprises a drawing die having two symmetrical halves. Thanks to this feature, the drawing die may be advantageously substituted in a simple manner, without interrupting the production method.

The above-mentioned conveying and co-sputtering steps, as well as any of the optional surface treatment, thermal treatment, and drawing steps of the method of the invention, are preferably carried out in a substantially continuous manner, without any substantial interruptions between two subsequent steps.

In such a way, it is advantageously possible to obtain a steel wire coated with a metal coating layer having a desired thickness by means of a production method which is carried out in a continuous manner from the step of producing the steel core of the wire to the optional step of drawing the coated core, optionally including additional conventional preliminary treatments effected on the core or additional finishing treatments effected on the coated core (e.g. a phosphating treatment of the core or of the coated core in order to improve the drawing thereof).

In accordance with a second aspect thereof, the present invention relates to an apparatus for producing a coated steel wire, said wire comprising a steel core and a coating layer made of a metal alloy material having a composition including at least one first metal component and at least one second metal component, the apparatus comprising:

a) at least one sputtering unit;

b) at least one device for conveying in a substantially continuous manner said steel core along a predetermined path within said sputtering unit;

c) at least one first cathode and at least one second cathode arranged within said sputtering unit, the at least one first cathode being made of said first metal component and the at least one second cathode being made of said second metal component; and d) at least one first adjustable power source connected to at least one of said first and second cathode (e.g. to the first cathode).

According to a preferred embodiment of the apparatus of the invention, the sputtering unit is a magnetron sputtering unit. This technique advantageously increases the deposition rate of the metal layers essentially thanks to the effect exerted on the electrically charged particles by a magnetic field, the latter inducing a confinement action on the electrons in proximity of the cathodes and thus increasing the plasma density.

In the following description, the expression "cathode" (or "magnetron") is used to indicate an assembly comprising the coating material (which is the target and is preferably in the form of a plate) and a plurality of magnets which are arranged behind the coating material and which create a magnetic trap for the charged particles—e.g. argon ions—in front of the coating material. Furthermore, since the sputtering process causes the heating of the coating material, generally the cathode further comprises a cooling system, typically a plurality of channels for the passage of cooling water thereinto.

Preferably, the conveying device comprises at least one device for feeding the steel core into the sputtering unit along a respective first forward length and at least one counter-device for feeding back the steel core along a respective backward length, the backward length being spaced apart with respect to the forward length by a predetermined distance. In this manner, the residence time of the steel core in the sputtering unit is advantageously increased.

Preferably, the at least one first cathode and the at least one second cathode are arranged with respect to the steel core, preferably arranged as a wire bundle as defined above, in such a manner as to sputter the first metal component and, respectively, the second metal component onto the steel core along respective first and second converging sputtering directions.

Preferably, the at least first and the at least second converging sputtering directions define an angle comprised between about 60° and about 120°, more preferably comprised between about 80° and about 100°.

According to a preferred embodiment of the invention, the apparatus comprises at least two pairs of first and second cathodes arranged on opposite sides of the wire bundle, wherein each pair of first and second cathodes is arranged in such a manner as to sputter said first and, respectively, said second metal component onto the steel core along respective first and second converging sputtering directions.

Preferably, the at least one first power source is adjustable by means of at least one power adjuster which regulates the power supplied from the first power source to one of the first and second cathode, e.g. the first cathode.

In order to achieve virtually any composition of the alloy material, the apparatus of the invention preferably further comprises at least one second adjustable power source connected to at least another of said first and second cathode (e.g. the second cathode), said second adjustable power source being independently adjustable with respect to said first adjustable power source.

Preferably, the at least one first power source and the at least one second power source are independently adjustable by means of at least one power adjuster which regulates the power supplied from the first and the second power source to the first and, respectively, to the second cathode.

Alternatively, the at least one first and the at least one second power source are independently adjustable by means of a first and of a second power adjuster for adjusting the power of the first and, respectively, of the second power source in an independent manner from each other.

The present invention further relates to a method for producing a steel cord for reinforcing an elastomeric material, said method comprising the steps of producing a plurality of steel wires coated by means of the method described above and the subsequent step of stranding said plurality of coated steel wires.

Finally, the present invention further relates to an apparatus for producing a steel cord for reinforcing an elastomeric material, said apparatus comprising, in addition to the components of the apparatus mentioned above with reference to the production of a coated steel wire, a device for stranding a plurality of coated steel wires.

BRIEF DESCRIPTION OF THE DRAWINGS

Additional features and advantages of the invention will become more readily apparent from the description of some preferred embodiments of a method according to the invention for producing a coated steel wire intended to reinforce elastomeric materials, of the type comprising a steel core and a coating layer made of a metal alloy material, made hereafter with reference to the attached drawings in which, for illustrative and not limiting purposes, two different preferred embodiments of the apparatus of the invention for producing a coated steel wire of the type comprising a steel core and a coating layer made of a metal alloy material intended to reinforce elastomeric materials are represented.

In the drawings, FIGS. 1 and 2 schematically show a partial cross-section view of a first and, respectively, of a second preferred embodiment of the apparatus of the invention for producing a coated steel wire of the type comprising a steel core and a coating layer made of a metal alloy material, the first and the second embodiment involving two different configurations of the cathodes.

DETAILED DESCRIPTION OF THE PREFERRED EMBODIMENTS

Figure 1:
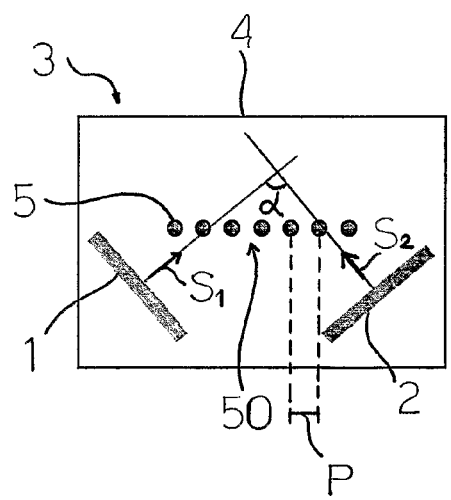

A first preferred embodiment of the apparatus of the present invention is schematically illustrated in FIG. 1. In such figure, in particular, a first cathode configuration is shown.

In the following description, for illustrative and not limiting purposes, reference will be made to the production of a coated steel wire comprising a steel core and a coating layer made of a binary metal alloy, such as for example brass having a copper content of from about 60 to about 72% by weight, intended to reinforce elastomeric materials, such as for example the belt layers of a tire.

With reference to FIG. 1, a first cathode 1 made of copper and a second cathode 2 made of zinc are arranged within a magnetron sputtering unit 3 comprising a vacuum deposition chamber 4 (which is subjected to a first predetermined pressure) and a first and a second pre-chamber (not shown) both subjected to a second predetermined pressure higher than said first predetermined pressure, said first and second pre-chamber being arranged upstream and, respectively, downstream of the vacuum deposition chamber 4.

In FIG. 1, the first cathode 1 and the second cathode 2 have a plate-shaped form and are arranged below a wire bundle 50 which is formed by a multipassage path of a steel core 5 and which comprises wire lengths substantially parallel to the longitudinal extension of the magnetron sputtering unit 3. The steel core 5 has an initial diameter from about 0.85 to about 2.85 mm. According to said embodiment, copper and, respectively, zinc are sputtered onto the wire bundle 50 along respective first and second converging sputtering directions $S_1$ and $S_2$. The converging sputtering directions $S_1$ and $S_2$ define an angle α of about 90° therebetween.

A plurality of first cathodes 1 made of copper and a plurality of second cathodes 2 made of zinc as those illustrated in FIG. 1 are successively arranged along the longitudinal development of the vacuum deposition chamber 4 of the magnetron sputtering unit 3.

According to a further embodiment (not shown), the cathodes 1, 2 are arranged to form a plurality of pairs of cathodes 1, 2 which are alternatively positioned below and above the wire bundle 50. In such a manner, an improved quality of the brass layer may be deposited onto the steel core 5.

Further components of the apparatus of the invention, namely a device for conveying the steel core along a predetermined path in a substantially continuous manner within the magnetron sputtering unit 3, a first and a second independently adjustable power source respectively connected to the first cathode 1 and to the second cathode 2, and a first and a second power adjuster for adjusting the power of the first and, respectively, of the second power source in an independent manner from each other, are not shown in schematic FIG. 1 since they are conventional per se.

In particular, the conveying device comprises a plurality of devices for feeding the steel core 5 into the magnetron sputtering unit 3 along a respective plurality of forward lengths and a plurality of counter-devices for feeding back the steel core 5 along a respective plurality of backward lengths, the backward lengths being spaced apart with respect to the forward lengths by a predetermined distance P. In this manner, the steel core 5 forms a wire bundle 50 lying on a horizontal plane which advantageously increases the residence time of the steel core 5 in the vacuum deposition chamber 4. Such plurality of devices and counter-devices are not shown as conventional per se. For example, such devices and counter-devices may comprise pulleys and respective counter-pulleys which are arranged on opposite sides of the magnetron sputtering unit 3.

As shown in FIG. 1, each forward length is spaced apart with respect to the adjacent backward length by a distance P, for example equal to about 3 mm, which is particularly suitable for a vacuum deposition chamber 4 having a width of 25 cm.

With reference to the apparatus described above, the method for producing a coated steel wire comprising a steel core 5 and a coating layer made of brass is described in the following.

The method may include a series of preliminary steps aimed at obtaining a steel core 5 of a predetermined diameter starting from a wire rod and a series of preliminary treatments performed on the steel core 5, such as for example a superficial treatment so as to eliminate any macrorugosity of the steel surface in order to improve the adhesion of the brass layer to the steel core 5, as well as a thermal treatment so as to obtain a pearlitic structure which is more suitable for the successive cold deformation.

According to said method, the steel core 5 is firstly conveyed along the above-mentioned predetermined path in a substantially continuous manner, for example at a speed comprised in the range from about 10 to about 80 m/min.

In a second step of the method, the cathode 1 made of copper and the cathode 2 made of zinc are co-sputtered onto the steel core 5, preferably in a substantially simultaneous manner.

Preferably, the co-sputtering step is carried out by setting a pressure in the order of $10^{-3}$-$5 \cdot 10^{-2}$ mbar in the vacuum deposition chamber 4, a voltage applied to the electrodes comprised between about 100 and about 1000 V and a current comprised between about 0.1 and about 10 A. The sputtering step essentially consists of a ionic bombardment of the cathodes with ions of the carrier gas obtained under the action of an electrical field generated by applying the voltage mentioned above. More specifically, ions of the carrier gas are accelerated towards the cathodes, essentially causing a series of collisions with a consequent emission of cathodes atoms directed towards the anode, i.e. towards the steel core, towards which free electrons are also accelerated. The free electrons ionize by collision further atoms of carrier gas, whereby the process repeats itself and self-sustains as far as sufficient energy is supplied.

By complying with the above-mentioned preferred voltage, current and gas pressure values, a deposition rate of brass comprised in the range from about 100 to about 1000 nm/min, depending on the distance between the cathodes 1, 2 and the steel core 5 is advantageously achieved. A distance between the cathodes 1, 2 and the steel core 5 ranging from about a few cm to some tens of cm as a function of the size of the cathodes 1, 2 has been found particularly preferred in terms of effectiveness of deposition.

In a third step of the method of the invention, the power provided to each of said cathodes 1, 2 is independently adjusted as a function of the desired composition of the brass alloy.

For example, with reference to the configuration of the cathodes shown in FIG. 1, a power from about 5.40 to about 7.92 kW has to be provided to the copper cathode 1 and a power from about 2.52 to about 4.40 kW has to be provided to the zinc cathode 2 in order to obtain a brass coating having a copper content comprised between 60% and 72% by weight.

The co-sputtering step is carried out until a predetermined initial thickness of the brass coating is obtained, such as for example comprised between about 0.5 and about 2.0 μm.

In a further step of the preferred embodiment of the method of the present invention shown in FIG. 1, the coated core is drawn until the steel core 5 has a final diameter smaller than the predetermined initial diameter and the brass layer has a final thickness smaller than the predetermined initial thickness.

For example, the initial diameter of the steel core 5 is comprised between about 0.85 mm and about 3 mm and the drawing step is carried out in such a way as to obtain a core having a final diameter comprised in the range of 0.10-0.50 mm.

Preferably, the drawing step of the coated core is carried out in an emulsion bath, for example containing a lubricating oil, and is carried out by drawing dies which are preferably made of tungsten carbide.

At the end of such a drawing step, a steel wire uniformly and homogeneously coated with a brass coating layer is obtained.

All the steps of the method of the invention are preferably carried out in a substantial continuous manner.

Figure 2:
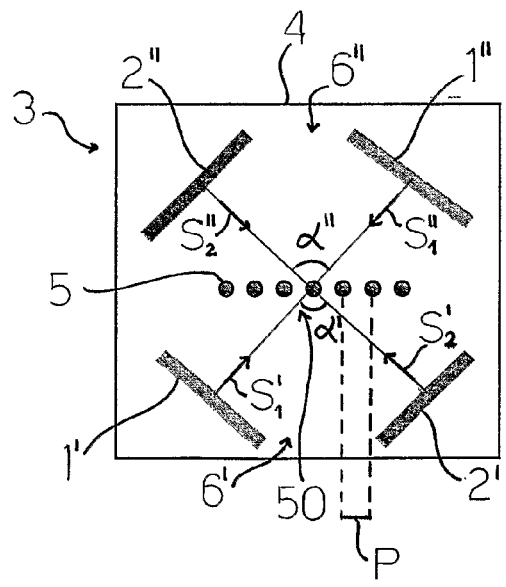

With reference to FIG. 2, a second preferred embodiment of the apparatus of the present invention, having a second cathode configuration, is shown. In the following description and in said figure, the elements of the apparatus for producing the coated steel wire which are structurally or functionally equivalent to those previously illustrated with reference to FIG. 1, will be indicated by the same reference numbers and will not be further described.

FIG. 2 shows two pairs 6', 6" of first 1', 1" and second 2', 2" cathodes which are arranged on opposite sides of a wire bundle 50. Each pair 6', 6" of cathodes is arranged in such a manner to sputter a first and, respectively, a second metal component onto the wire bundle along respective first $S_1'$, $S_1''$ and second $S_2'$, $S_2''$ converging sputtering directions. For example, the cathodes 1', 2' of the pair 6' are made of copper and, respectively, of zinc. In an analogous manner, the cathodes 1'', 2'' of the pair 6'' are made of copper and, respectively, of zinc. Thanks to this configuration, it is advantageously possible to obtain a uniform brass coating onto the steel core 5 forming the wire bundle 50.

The converging sputtering directions $S_1'$ and $S_2'$ of the first pair 6' of cathodes 1', 2' and the converging sputtering directions $S_1''$ and $S_2''$ of the second pair 6'' of cathodes 1'', 2'' define respective angles $\alpha'$, $\alpha''$, said angles being of about 90°.

Preferably, a plurality of such pairs 6', 6'' of cathodes are successively arranged in the magnetron sputtering unit 3 along the longitudinal extension thereof.

With reference to the apparatus shown in FIG. 2, the method of the invention comprises the same steps described above with reference to the first embodiment of the method of the invention, except for the fact that the co-sputtering step is carried out by sputtering, in a substantially simultaneous manner, the above-mentioned pairs 6', 6'' of cathodes.

For example, with reference to the configuration of the cathodes shown in FIG. 2, a power from about 5.40 to about 7.92 kW has to be provided to the copper cathodes 1', 1'' and a power from about 2.52 to about 4.40 kW has to be provided to the zinc cathodes 2', 2'' in order to obtain a brass coating having a copper content comprised between 60% and 72% by weight.

Further preferred embodiments of the method and the apparatus of the invention may be envisaged without departing from the scope of the attached claims. For example, in order to avoid any interruption in the sputtering process due to the consumption of the copper and/or the zinc cathodes or due to a change of the type of metal components forming the alloy of the coating layer, the co-sputtering may be carried out in a first vacuum deposition chamber, a second vacuum deposition chamber being arranged in series with the first one and being set in a stand-by mode. In the second vacuum deposition chamber analogous plate-shaped cathodes may be arranged as described above. Both first and second vacuum deposition chambers contain a carrier gas, such as for example argon, at a predetermined first pressure, preferably comprised between about $10^{-3}$ mbar and about $10^{-1}$ mbar.

In particular, before being conveyed in the first vacuum deposition chamber, in order to preserve the first and, when used, the second vacuum deposition chamber from dust and other contaminants, a first pre-chamber and a second pre-chamber are arranged upstream of the first and, respectively, the second vacuum deposition chamber.

A third pre-chamber may be further provided downstream of the second vacuum deposition chamber. In other words, the first pre-chamber, the first vacuum deposition chamber, the second pre-chamber, the second vacuum deposition chamber and the third pre-chamber are successively arranged in series.

The first, the second and the third pre-chambers may contain argon subjected to a second predetermined pressure higher than said first predetermined pressure, for example in the order of 0.5 mbar.

In such way, the desired vacuum condition of $10^{-3}$ mbar-$10^{-1}$ mbar is advantageously achieved in each vacuum deposition chamber in a stepwise manner.

The invention is further described by way of the following illustrative examples.

EXAMPLE 1

A 6 m long magnetron sputtering unit was used comprising a 5 m long vacuum deposition chamber subjected to a first predetermined pressure, for example equal to about $5 \cdot 10^{-2}$ mbar. A first pre-chamber and a second pre-chamber, both subjected to a second predetermined pressure higher than said first predetermined pressure (for example equal to about 0.5 mbar) were arranged upstream and, respectively, downstream of the vacuum deposition chamber. The vacuum deposition chamber and the pre-chambers contained the same carrier gas, such as for example argon, subjected to the above-mentioned values of pressure. Downstream of the second pre-chamber drawing dies made of tungsten carbide were arranged in a bath containing a lubricating oil, namely an emulsion in water of 10% by weight of a lubricating agent.

The vacuum deposition chamber comprised ten pairs of plate-shaped first and second cathodes (45×7×1 cm) made of copper and, respectively, of zinc (both having a purity of 99.9%), alternately arranged on opposite sides of the wire bundle formed by the steel core conveyed along the above-mentioned multipassage path, each pair of first and second cathodes being arranged to co-sputter copper and, respectively, zinc onto the wire bundle along respective first and second converging sputtering directions as illustrated in FIG. 1. The ten pairs of cathodes were arranged in sequence alternately below and above the wire bundle, so as to alternate the cathodes belonging to two consecutive pairs of cathodes.

The distance between the cathodes and the wire bundle was equal to about 39 mm.

A steel core, having a diameter of about 1.14 mm, was coated with a brass layer having a copper content of 63% by weight and a zinc content of 37% by weight and an initial thickness of 1.5 µm. More particularly, the steel core was conveyed in a substantially continuous manner in the pre-chamber at a speed of about 70 m/min, then in the vacuum deposition chamber along a multipassage path lying in a substantially horizontal plane at the same speed. The path comprised a total number of 39 forward and backward lengths each measuring 500 cm and spaced apart by a distance of about 3 mm.

The steel core was conveyed along the path described above and the cathodes were co-sputtered onto the steel core in a substantially simultaneous manner until an initial thickness of brass of about 1.5 µm was attained. A voltage of about 350 V and a current of about 1.62 A were used. According to such working conditions (voltage, current, gas pressure values) a brass deposition rate of about 800 nm/min was achieved.

The power provided to each of said first and second cathodes were independently adjusted as a function of the composition of the brass. To this purpose, a first and a second power sources were used, each power source being connected to the first and, respectively, to the second cathodes. In order to obtain the above-mentioned composition of brass, the first power source, i.e. the power source connected to the copper cathodes, was set to 5.67 kW and the second power source, i.e. the power source connected to the zinc power cathodes, was set to 3.33 kW.

Subsequently, the brassed steel core was conveyed in the second pre-chamber at a speed of about 70 m/min and finally drawn in the emulsion bath by means of the drawing die to a diameter of 0.20 mm, corresponding to a brass layer having a final thickness of 0.20 µm.

Finally, a stranding step of a plurality of brassed steel wires obtained as described above was provided so as to obtain a cord suitable for reinforcing elastomeric materials.

EXAMPLE 2

A magnetron sputtering unit according to the one described in Example 1 was used.

A steel core, having a diameter of about 1.14 mm, was coated with a brass layer having a copper content of 67% by weight and a zinc content of 33% by weight and an initial thickness of 1.5 μm. The steel core was conveyed in the first pre-chamber as described in Example 1 and subsequently in the vacuum deposition chamber along the same path and under the same operative conditions described in Example 1.

In order to obtain such a composition of brass, the first power source, i.e. the power source connected to the copper cathodes, was set to 6.03 kW and the second power source, i.e. the power source connected to the zinc power cathodes, was set to 2.97 kW.

Subsequently, the brassed steel core was conveyed in the second pre-chamber and finally drawn in the emulsion bath by means of the drawing die to a diameter of 0.22 mm, corresponding to a brass layer having a final thickness of 0.20 μm.

A cord intended to reinforce elastomeric materials was obtained and then incorporated in articles of elastomeric materials as described in Example 1.

EXAMPLE 3

A magnetron sputtering unit as the one described in Example 1 was used, with the exception that the vacuum deposition chamber comprised five groups of plate-shaped cathodes (45×7×1 cm) and the length of the sputtering unit was about 3 m long. Each group of cathodes consisted of two pairs of first and second cathodes made of copper and, respectively, of zinc (both having a purity of 99.9%) which were arranged on opposite sides of the wire bundle so as to extend along the above-mentioned path. Each pair of first and second cathodes was arranged to co-sputter copper and, respectively, zinc onto the wire bundle along respective first and second converging sputtering directions as illustrated in the embodiment of FIG. 2. The five groups were arranged in sequence so as to alternate the first and second cathodes in each group as well as the cathodes belonging to two consecutive groups.

A steel core, having a diameter of about 1.60 mm, was coated with a brass layer having a copper content of 63% by weight and a zinc content of 37% by weight and an initial thickness of 1.5 μm. The steel core was conveyed in the first pre-chamber at a speed of about 50 m/min and subsequently in the vacuum deposition chamber along a path comprising a total number of 23 forward and backward lengths each measuring 250 cm and spaced apart by a distance of about 3 mm.

The remaining operative conditions were the same as those described in Example 1.

In order to obtain the above-mentioned composition of brass, the first power source, i.e. the power source connected to the copper cathodes, was set to 6.93 kW and the second power source, i.e. the power source connected to the zinc power cathodes, was set to 4.07 kW.

Subsequently, the brassed steel core was conveyed in the second pre-chamber and finally drawn in the emulsion bath by means of the drawing die to a diameter of 0.28 mm, corresponding to a brass layer having a final thickness of about 0.20 μm.

A cord intended to reinforce elastomeric materials was obtained and then incorporated in articles of elastomeric materials as described in Example 1.

EXAMPLE 4

A magnetron sputtering unit as the one described in Example 3 was used.

A steel core, having a diameter of about 1.60 mm, was coated with a brass layer having a copper content of 67% by weight and a zinc content of 33% by weight and an initial thickness of 1.5 μm. The steel core was conveyed in the first pre-chamber as described in Example 3 and subsequently in the vacuum deposition chamber along the same path and under the same operative conditions described in Example 3.

In order to obtain such a composition of brass, the first power source, i.e. the power source connected to the copper cathodes, was set to 7.37 kW and the second power source, i.e. the power source connected to the zinc power cathodes, was set to 3.63 kW.

Subsequently, the brassed steel core was conveyed in the second pre-chamber and finally drawn in the emulsion bath by means of the drawing die to a diameter of 0.28 mm, corresponding to a brass layer having a final thickness of 0.20 μm.

A cord intended to reinforce elastomeric materials was obtained and then incorporated in articles of elastomeric materials as described in Example 1.

The invention claimed is:

1. A method for producing a coated steel wire, said wire comprising a steel core and a coating layer made of a metal alloy material having a composition comprising at least one first metal component and at least one second metal component, comprising the steps of:
   a) conveying the steel core along a predetermined path in a substantially continuous manner through a first and a second vacuum deposition chamber, said path comprising at least one forward length and at least one backward length spaced apart by a predetermined distance, the at least one forward length and the at least one backward length being substantially parallel with respect to one another, the first vacuum deposition chamber comprising a first group of cathodes, and the second vacuum deposition chamber comprising a second group of cathodes; and
   b) during said conveying of the steel core in a substantially continuous manner through the first and second vacuum deposition chambers:
      i) while the second group of cathodes is maintained in a stand-by mode, co-sputtering at least a first powered cathode made of said first metal component and at least a second powered cathode made of said second metal component onto the steel core being moved along said predetermined path, the first and the second powered cathodes belonging to the first group of cathodes;
      ii) when the first group of cathodes is consumed, co-sputtering at least a third powered cathode made of said first metal component and at least a fourth powered cathode made of said second metal component onto the steel core being moved along said predetermined path, the third and the fourth powered cathodes belonging to the second group of cathodes; and
      iii) adjusting the power provided to at least one of said first, second, third, and fourth cathodes.

2. The method according to claim 1, wherein said conveying step is carried out along a substantially rectilinear path.

3. The method according to claim 1, wherein said co-sputtering comprises sputtering said first and, respectively, second metal components onto the steel core along respective first and second converging sputtering directions.

4. The method according to claim 1, wherein said co-sputtering is carried out by means of a magnetron sputtering technique involving ionic bombardment of said at least one first and at least one second cathode.

5. The method according to claim 1, wherein said co-sputtering is carried out until a predetermined initial thickness of a coating layer is attained, said method further comprising the step of drawing the coated steel wire until the steel core has a final diameter smaller than a predetermined initial diameter and the coating layer has a final thickness smaller than said predetermined initial thickness.

6. The method according to claim 1, wherein said adjusting step is carried out by independently adjusting the power provided to each of said first and second cathodes or each of said third and fourth cathodes.

* * * * *